United States Patent [19]

Butler

[11] Patent Number: 4,538,115
[45] Date of Patent: Aug. 27, 1985

[54] JFET DIFFERENTIAL AMPLIFIER STAGE WITH METHOD FOR CONTROLLING INPUT CURRENT

[75] Inventor: James R. Butler, San Jose, Calif.

[73] Assignee: Precision Monolithics, Inc., Santa Clara, Calif.

[21] Appl. No.: 621,053

[22] Filed: Jun. 15, 1984

[51] Int. Cl.³ .......................... H03F 3/16; H03F 3/45
[52] U.S. Cl. .................................... 330/253; 330/277; 330/311
[58] Field of Search ................ 330/253, 261, 277, 311

[56] References Cited

PUBLICATIONS

Wyland, D. C., "FET Cascode Technique Optimizes Differential Amplifier Performance", *Electronics*, 1-1-8-71, pp. 81–84.
Burr–Brown OPA-111 Catalogue Sheet, 1984, OPA-100 Catalogue Sheet, 1983.
Steve Millaway, "Monolithic OP Amp Hits Trio of Lows", Electronic Design, Feb. 9, 1984, pp. 97–101.
Harris Corporation, HA-5180/5180A Catalogue Sheet, 1982.
Precision Monolithics, Inc., OP-215 Catalogue Sheet, 1983.

*Primary Examiner*—Eugene R. LaRoche
*Assistant Examiner*—Steven J. Mottola
*Attorney, Agent, or Firm*—Koppel & Harris

[57] ABSTRACT

A JFET differential amplifier stage in which the gate-drain voltage of each JFET is kept at least as great as the pinchoff voltage ($V_p$), but preferably close to $V_p$ so as to reduce the effects of impact ionization and generation currents on the amplifier's input bias currents. The JFETs are supplied with currents which force their gate-source voltages to at least 0.5 $V_p$. A second pair of JFETs are cascoded with the first pair and also develop gate-source voltages of at least 0.5 $V_p$. The gate-source terminals of the second pair are connected in a loop with the source-drain terminals of the first pair, thereby forcing the gate-drain voltages of the first pair to at least $V_p$, the minimum voltage necessary to hold the first pair in a desired saturated state. A third pair of JFETs is connected to buffer the first pair from capacitances developed at the gates of the second pair without effecting the AC operation of the circuit.

7 Claims, 2 Drawing Figures

JFET DIFFERENTIAL AMPLIFIER STAGE WITH METHOD FOR CONTROLLING INPUT CURRENT

BACKGROUND OF THE INVENTION

1. Field of the Invention

This invention relates to differential amplifier circuits, and more particularly to differential amplifier circuits employing junction field effect transistors (JFETs) as the differential sensing elements.

2. Description of the Prior Art

It is generally desirable to reduce input bias currents in numerous types of electrical circuits. In differential amplifiers which employ JFETs as the differential elements, input bias currents may be attributed to four principal factors:

(1) impact ionization currents resulting from avalanche multiplication;

(2) generation currents formed within the space charge region due to generation-recombination centers;

(3) epitaxial-to-substrate junction leakage currents, for circuits in which junction isolation rather than dielectric isolation is used; and (4) diffusion currents resulting from electron-hole pairs generated outside of the space charge region diffusing into the space charge region.

Efforts to reduce the input bias current have generally focused on reducing the epitaxial-substrate junction leakage current by the introduction of various compensating currents. These efforts have not addressed the effect of impact ionization current, which can be quite significant when the JFETs are operated at high currents and with large gate-drain voltages.

It is normally desirable to operate the JFETs in the saturated region, at which they exhibit a high output impedance. Saturation is reached when the gate-drain voltage exceeds the device's pinchoff voltage ($V_p$). In this mode a region of the JFET channel is pinched off, and the drain current that continues to flow is substantially independent of variations in the gate-drain voltage. In order to assure that the JFETs remain saturated, their gate-drain voltages may be held at a level much greater than $V_p$, thereby substantially increasing the impact ionization current contribution to input bias current.

SUMMARY OF THE INVENTION

In view of the above problems associated with the prior art, it is an object of this invention to provide a novel and improved JFET differential amplifier stage characterized by a reduced input bias current.

Another object is the provision of a novel and improved JFET differential amplifier stage in which the gate-drain voltages of the JFETs are set at a level at which the effect of impact ionization current on the total input bias current is very small, and a method of maintaining the gate-drain voltages at this level.

In the accomplishment of these and other objects of the invention, paired JFETs connected in a differential stage are supplied with sufficient current to establish their gate-source voltages at less than $V_p$. Circuit means connected between the JFET sources and drains develop voltages which are at least as great as the differential between the gate-source voltages and $V_p$, thereby maintaining the gate-drain voltages at at least $V_p$ to keep the JFETs saturated. The circuit means are selected to develop a voltage which is approximately equal to the differential between the JFET gate-source voltages and $V_p$, thereby setting the gate-drain voltages and the resulting input bias currents at the minimum level necessary to keep the JFETs saturated.

In a preferred embodiment the circuit means comprise a second pair of JFETs which are cascoded with the first pair, with their gates held at substantially the same voltage as the source voltages of the first pair. The JFETs are each supplied with a current which is approximately equal to $0.25I_{DSS}$, thereby utilizing a known JFET relationship to establish a gate-source voltage for each JFET which is approximately equal to $0.5V_p$. Since the gates of the second JFET pair are maintained at substantially the same voltage as the sources of the first pair, the cumulative gate-source voltages produce gate-drain voltages for the first pair which are approximately equal to $V_p$. This is the minimum voltage necessary to keep the JFETs saturated, and results in a reduced input bias current. A third pair of JFETs are employed to buffer the first pair from capacitances at the gates of the second pair.

These and other object and features of the invention will be apparent to those skilled in the art from the ensuing detailed description of preferred embodiments, together with the accompanying drawings, in which:

DETAILED DESCRIPTION OF PREFERRED EMBODIMENTS

Figure 1:
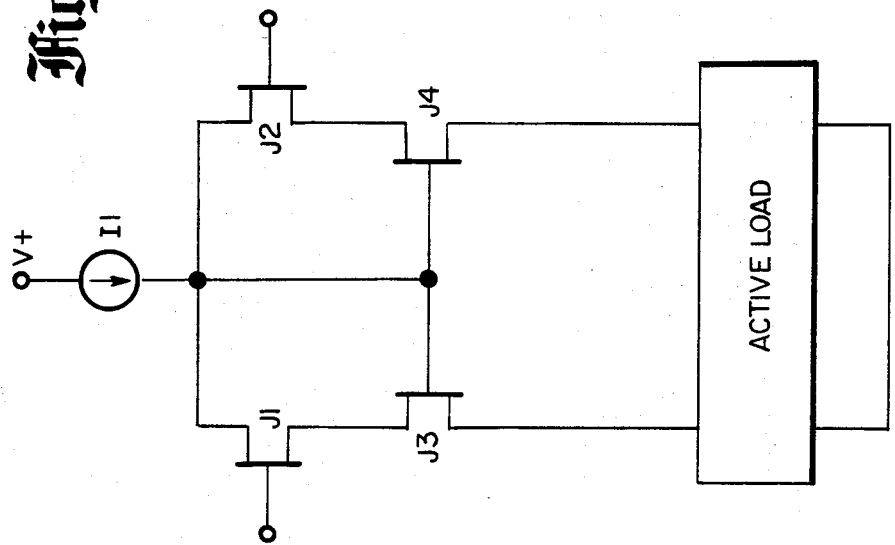
FIG. 1 is a schematic diagram of a basic form of the invention.

A basic form of the invention is shown in FIG. 1. A pair of depletion-type JFETs J1 and J2 are connected in a differential amplifier stage with their sources tied together and their gates adapted to receive respective bias voltages. A current source I1 is connected to a positive voltage bus V+, typically 15 volts, and supplies current to the common source connection of J1 and J2. In normal operation the current from I1 is divided substantially equally between J1 and J2.

An additional pair of JFETs J3 and J4 are cascoded (i.e., connected in series) with J1 and J2, the sources of J3 and J4 being connected to the drains of J1 and J2, respectively. The gates of J3 and J4 are connected back to the common source connection for J1 and J2, thereby holding the gates of J3 and J4 at the same voltage level as the sources of J1 and J2.

The drains of J3 and J4 carry output currents $I_{o1}$ and $I_{o2}$, respectively, to an active load circuit 2. The active load circuit may be of the type disclosed in the copending patent application by the same inventor entitled "JFET Active Load Input Stage", Ser. No. 615,996, filed May 31, 1984, or some other load circuit employing active circuit elements.

J1, J2, J3 and J4 are all preferably matched with each other, although the circuit parameters can be adjusted to account for non-matching transistors. With the transistors matched, I1 is selected to supply a current equal to $0.5I_{DSS}$ of the various transistors. $I_{DSS}$ is defined as the drain current that will flow when the gate and source of a JFET are tied together, and is a common parameter employed in characterizing JFETs. Since the JFETs of a differential amplifier will normally divide a supplied current approximately equally, JFET 1–JFET 4 will each carry source and drain currents of approximately $0.25I_{DSS}$. In accordance with known JFET characteristics, at this current level the gate-source voltage of each JFET will be equal to approximately $0.5V_p$. Thus, the J1 and J3 source voltages will each exceed their respective gate voltages by approximately $0.5V_p$. Since the source of J1 is held at the same voltage level as the gate of J3, and the drain of J1 is held at the same voltage level as the source of J3, the J1 gate-drain voltage will be held to approximately $0.5\ V_p$ plus $0.5\ V_p$, or approximately $V_p$. In the same manner, the J2 gate-drain voltage will also be held to approximately $V_p$.

Since $V_p$ is the minimum gate-drain voltage necessary to keep J1 and J2 in the desired saturation state, J1 and J2 will remain saturated. As the impact ionization current through these JFETs varies exponentially with the applied reverse bias voltage, the relatively low gate-drain voltages will assure a low level of impact ionization current, and accordingly a lower input bias current. The generation current will also be reduced, although not by as great a degree as the impact ionization current, thereby further reducing the total input bias current.

Operation with the gate-drain voltages of J1 and J2 at exactly $V_p$ is the optimum condition for minimizing input bias current while keeping the JFETs saturated. Reductions in the level of I1 below $0.5I_{DSS}$, which will cause the current through each individual JFET to fall to a level below $0.25I_{DSS}$, will increase the gate-source voltage of each JFET to a level greater than $0.5V_p$, since the gate-source voltages vary inversely with transistor current. Thus, in order to keep J1 and J2 saturated, the current through each transistor should be kept at a level no greater than $0.25I_{DSS}$, and I1 should accordingly be no greater than $0.5I_{DSS}$. Lesser current levels may be employed to compensate for processing variations and transients in order to assure that the transistors remain saturated, but if I1 is reduced to a level significantly less than $0.5I_{DSS}$, the increase in input bias current can be substantial.

Although it is desirable to have all of the transistors matched with each other to enhance circuit balance and common mode voltage range (the range of input voltages over which the required performance specifications of the amplifier are satisfied), J3 and J4 may also be scaled to a size different from J1 and J2. In that event the magnitude of I1 might have to be adjusted to assure that the gate-drain voltage of J1 and J2 is maintained at at least $V_p$.

Figure 2:
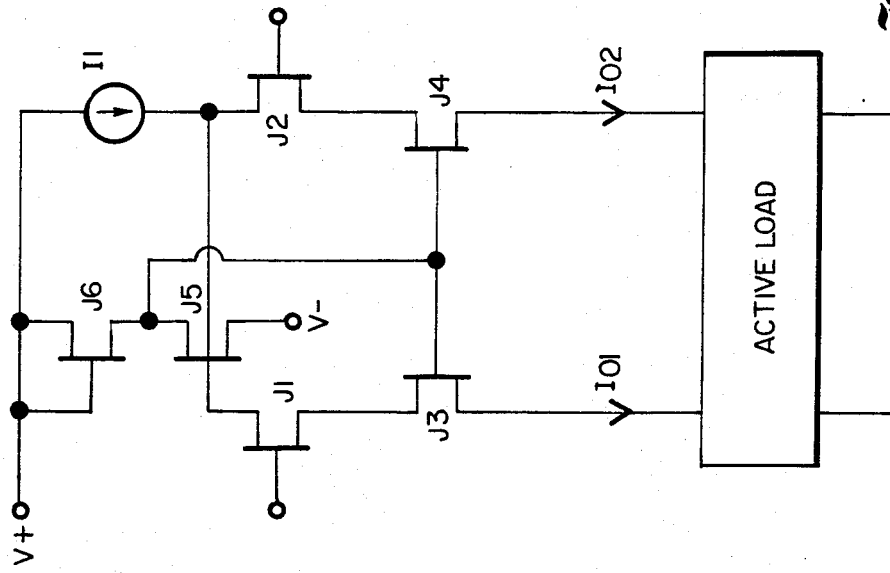
FIG. 2 is a schematic diagram of a form of the invention which utilizes capacitance buffering.

Referring now to FIG. 2, an improved form of the basic circuit is shown in which additional JFETs J5 and J6 have been added to buffer J1 and J2 from large capacitances which can develop at the gates of J3 and J4, thereby mitigating the effect of such capacitances on the AC operation of the amplifier. In this circuit the connection between the gates of J3,J4 and the sources of J1,J2 is routed through the source-drain circuit of J5, with the source of J5 connected to the gates of J3,J4 and the gate of J5 connected to the sources of J1,J2. The J5 drain is connected to a negative voltage bus V−, which is typically −15 volts.

The gate and source of J6 are connected together to V+, while its drain is connected to the source of J5. Since the gate and source of J6 are shorted together, by definition J6 must carry a current equal to $I_{DSS}$. This current is delivered to J5, which accordingly also assumes a substantially zero source-gate voltage. Thus, the sources of J1,J2 are still effectively maintained at the same voltage level as the gates of J3,J4, and the buffer transistors J5,J6 do not interfere with the AC operation of the circuit.

While particular embodiments of the invention have been shown and described, numerous variations and alternate embodiments will occur to those skilled in the art. Accordingly, it is intended that the present invention be limited only in terms of the appended claims.

I claim:

1. A JFET (junction field effect transistor) differential amplifier stage, comprising:

first and second JFETs connected in a differential amplifier stage with their sources connected together, and their gates adapted to receive respective input voltage signals, a current source connected to supply current to the JFETs, the magnitude of current supplied by said current source being great enough to establish gate-source voltages for the two JFETs which are less than their pinchoff voltages ($V_p$), a third JFET cascoded with the first JFET and with its gate connected in circuit with the source of the first JFET, a fourth JFET cascoded with the second JFET and with its gate connected in circuit with the source of the second JFET, said third and fourth JFETs each developing a voltage at least as great as the differential between the gate-source voltage and $V_p$ for their respective first and second JFETs, whereby the gate-drain voltages of the first and second JFETs are maintained at at least $V_p$ to keep them in a saturated mode with a high ouput impedance, and fifth and sixth JFETs connected to buffer the first and second JFETs from capacitances at the gates of the third and fourth JFETs.

2. A JFET (junction field effect transistor) differential amplifer stage, comprising:

first and second JFETs connected in a differential amplifier stage with their sources connected together, and their gates adapted to receive respective input voltage signals, a current source connected to supply current to the JFETs, the magnitude of current supplied by said current source being great enough to establish gate-source voltages for the two JFETs which are less than their pinchoff voltages ($V_p$), a third JFET cascoded with the first JFET and with its gate connected in circuit with the source of the first JFET, a fourth JFET cascoded with the second JFET and with its gate connected in circuit with the source of the second JFET, the third and fourth JFETs being matched with the first and second JFETs and each developing a voltage at least as great as the differential between the gate-source voltage and $V_p$ for their respective first and second JFETs, whereby the gate-drain voltages of the first and second JFETs are maintained at at least $V_p$ to keep them in a saturated mode with a high output impedance.

3. A JFET (junction field effect transistor) differential amplifier stage characterized by a low input bias current, comprising:

first and second JFETs connected in a differential amplifier stage with their sources connected together and their gates adapted to receive respective input voltage signals, third and fourth JFETs cascoded respectively with the first and second JFETs, the gates of the third and fourth JFETs connected respectively in circuit with and at substantially the same potential as the sources of the first and second JFETs, and their drains providing output currents, a current source connected to supply source current to the cascoded JFETs in an amount which is no greater than $0.25I_{DSS}$ for each JFET, thereby establishing a gate-source voltage for each JFET which is at least as great as $0.5V_p$, and accordingly a gate-drain voltage for the first and second JFETs which is at least as great as $V_p$ for those JFETs, whereby the first and second JFETs are kept in a saturated mode with a high output impedance, and fifth and sixth JFETs connected to buffer the first and second JFETs from capacitances at the gates of the third and fourth JFETs, the fifth JFET having its gate connected to the sources of the first and second JFETs, its source connected to the gates of the third and fourth JFETs, and its drain connected to a negative bias, said sixth JFET having its gate and source connected together and its drain connected to the source of the fifth JFET.

4. The JFET differential amplifier stage of claim 3, said fifth JFET being matched with the sixth JFET and receiving current substantially equal to $I_{DSS}$ from the sixth JFET, whereby the gate-source voltage of the fifth JFET is substantially zero, thereby substantially equalizing the source voltages of the first and second JFETs and the gate voltages of the third and fourth JFETs.

5. The JFET differential amplifier stage of claim 4, wherein the fifth and sixth JFETs are matched with the first through fourth JFETs.

6. A method of controlling the input bias currents to a first pair of JFETs which are connected in a differential amplifier stage with their sources connected together and their gates adapted to receive respective input voltage signals, comprising:

cascoding the first pair of JFETs with a second pair of JFETs, maintaining the source voltages of the first pair of JFETs substantially equal to the gate voltages of the second pair of JFETs, directing a predetermined current no greater than $0.25I_{DSS}$ through each JFET, whereby the gate-source voltage of each JFET is maintained at a level at least as great as $0.5V_p$, and the gate-drain voltages of the first pair of JFETs are maintained at a level at least as great as $V_p$, thereby maintaining the first pair of JFETs saturated with a predetermined gate-drain voltage, and buffering the first pair of JFETs from capacitances at the gates of the second pair of JFETs.

7. The method of claim 6, wherein the source-drain current directed through each JFET is approximately $0.25I_{DSS}$, thereby maintaining the gate-drain voltages of the first pair of JFETs at approximately $V_p$ to keep their input bias currents relatively low while holding them in saturation.

* * * * *